United States Patent
Tsai et al.

(10) Patent No.: US 10,269,569 B2
(45) Date of Patent: Apr. 23, 2019

(54) SEMICONDUCTOR DEVICE AND METHODS OF MANUFACTURE

(71) Applicant: Taiwan Semiconductor Manufacturing Company, Ltd., Hsinchu (TW)

(72) Inventors: Jung-Shiung Tsai, New Taipei (TW); Chung-Chiang Wu, Taichung (TW); Wei-Fan Liao, Donggang Township (TW); Han-Ti Hsiaw, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/783,153

(22) Filed: Oct. 13, 2017

(65) Prior Publication Data

US 2018/0151373 A1 May 31, 2018

Related U.S. Application Data

(60) Provisional application No. 62/427,526, filed on Nov. 29, 2016.

(51) Int. Cl.
| | |
|---|---|
| *H01L 21/44* | (2006.01) |
| *H01L 21/28* | (2006.01) |
| *H01L 29/40* | (2006.01) |
| *H01L 29/49* | (2006.01) |
| *H01L 29/66* | (2006.01) |
| *H01L 29/78* | (2006.01) |

(52) U.S. Cl.
CPC ...... *H01L 21/28088* (2013.01); *H01L 29/401* (2013.01); *H01L 29/4966* (2013.01); *H01L 29/66545* (2013.01); *H01L 29/66795* (2013.01); *H01L 29/785* (2013.01); *H01L 29/7845* (2013.01); *H01L 29/7851* (2013.01)

(58) Field of Classification Search
CPC ............ H01L 21/28088; H01L 29/401; H01L 29/66795; H01L 29/4966
USPC ............................................... 438/680, 980
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 9,935,173 B1* | 4/2018 | Wu | ............ H01L 29/4966 |
| 2002/0190379 A1 | 12/2002 | Jian et al. | |
| 2003/0203608 A1 | 10/2003 | DeBoer et al. | |
| 2009/0159994 A1 | 6/2009 | Park | |
| 2010/0140717 A1 | 6/2010 | Lavoie et al. | |
| 2013/0113053 A1 | 5/2013 | Lin et al. | |
| 2014/0061931 A1 | 3/2014 | Kang | |

(Continued)

FOREIGN PATENT DOCUMENTS

| | | |
|---|---|---|
| KR | 20140029041 A | 3/2014 |
| KR | 20160079031 A | 7/2016 |
| KR | 20160126147 A | 11/2016 |

*Primary Examiner* — David S Blum
(74) *Attorney, Agent, or Firm* — Slater Matsil, LLP

(57) ABSTRACT

A semiconductor device and method of manufacture are provided. In an embodiment a metal layer is formed over a substrate using a fluorine-free deposition process, a nucleation layer is formed over the metal layer using a fluorine included deposition process, and a fill material is formed to fill an opening and form a gate stack.

20 Claims, 12 Drawing Sheets

(56) References Cited

U.S. PATENT DOCUMENTS

| | | |
|---|---|---|
| 2014/0282326 A1 | 9/2014 | Chen et al. |
| 2016/0181163 A1 | 6/2016 | Huang et al. |
| 2016/0233220 A1* | 8/2016 | Danek ............... H01L 27/10891 |
| 2016/0315088 A1 | 10/2016 | Kang et al. |
| 2016/0379879 A1 | 12/2016 | Hotta et al. |
| 2017/0110375 A1* | 4/2017 | Bao ................... H01L 21/82384 |

* cited by examiner

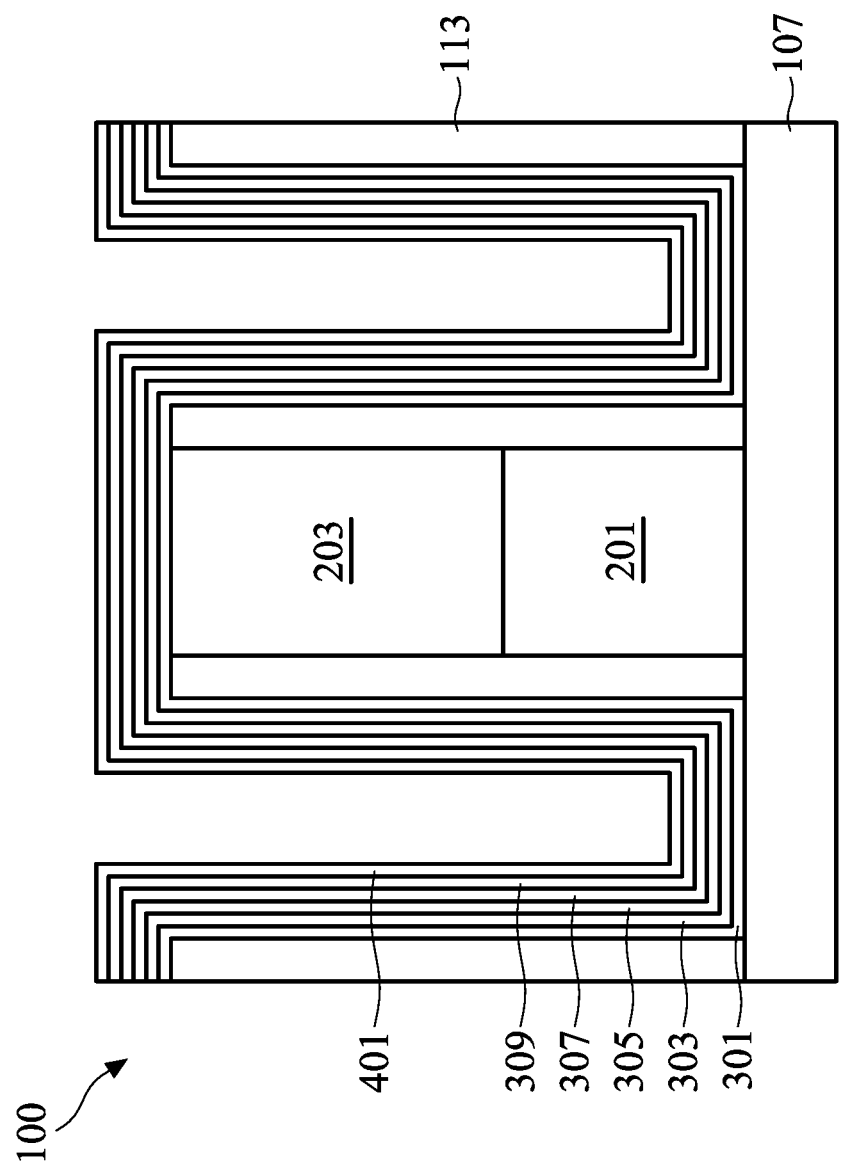

SEMICONDUCTOR DEVICE AND METHODS OF MANUFACTURE

PRIORITY

This application claims priority to and the benefit of U.S. Provisional Application No. 62/427,526, filed on Nov. 29, 2016, entitled "Fluorine-Free Barrier for Metal Gate Device," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4C illustrate a formation of a metal layer in accordance with some embodiments.

DETAILED DESCRIPTION

Figure 1:
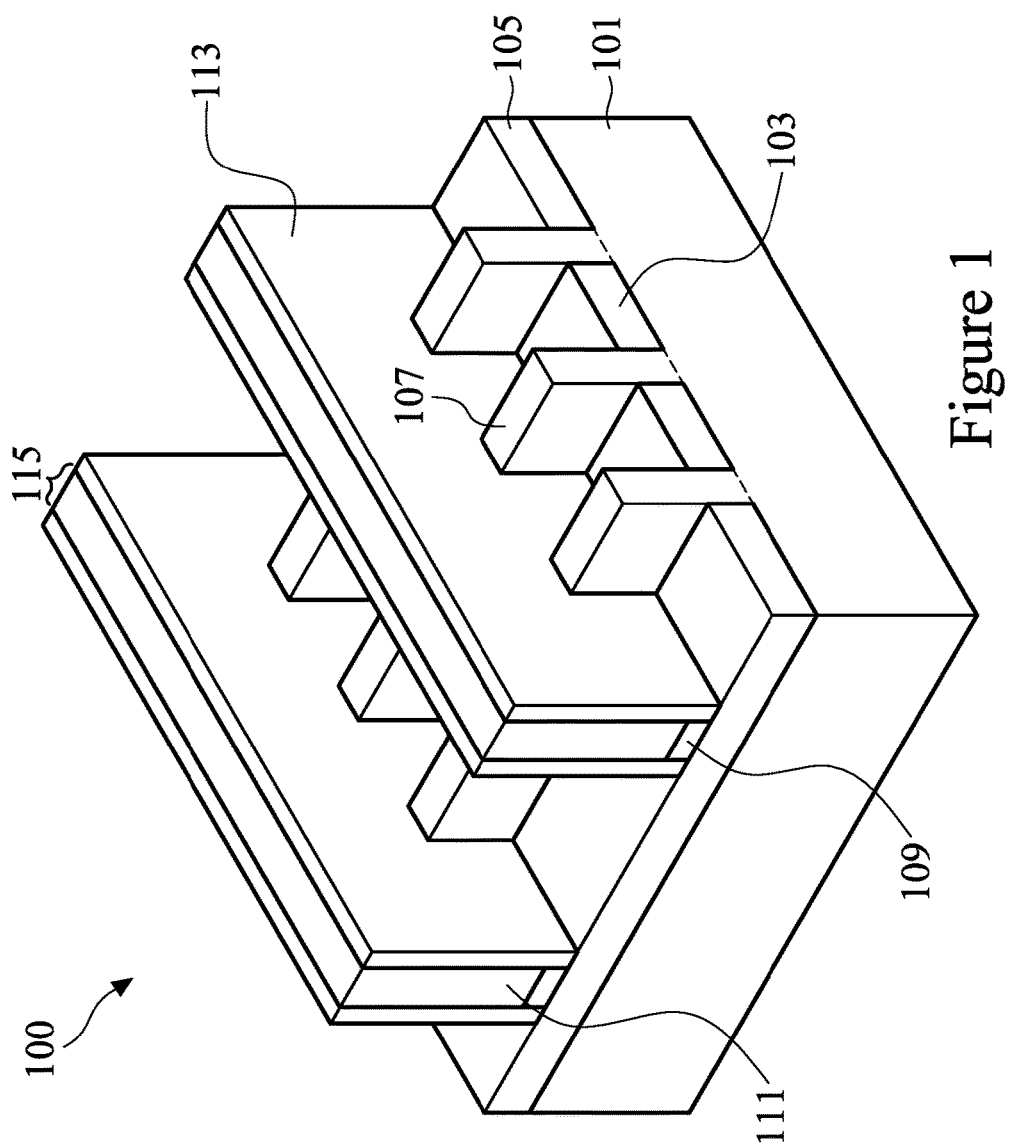
FIG. 1 illustrates steps in a process of forming a finFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described below with respect to specific embodiments, including a replacement metal gate for use with 10 nm technology nodes or smaller. Embodiments, however, are not intended to be limited, and may be utilized in a wide variety of embodiments beyond the 10 nm technology node.

With reference now to FIG. 1, there is illustrated a perspective view of a semiconductor device 100 such as a finFET device. In an embodiment the semiconductor device 100 comprises a substrate 101 and first trenches 103. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFETs. While FIG. 1 only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive material and may be selected from a group comprising of W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The spacer layer may then be patterned, such as by one or more etches to remove the spacer layer from the horizontal surfaces of the structure, to form the first spacers 113.

In an embodiment the first spacers 113 may be formed to have a thickness of between about 5 Å and about 500 Å. Additionally, once the first spacers 113 have been formed, a first spacer 113 adjacent to one stack 115 may be separated from a first spacer 113 adjacent to another stack 115 by a distance of between about 5 nm and about 200 nm, such as about 20 nm. However, any suitable thicknesses and distances may be utilized.

Figure 2:
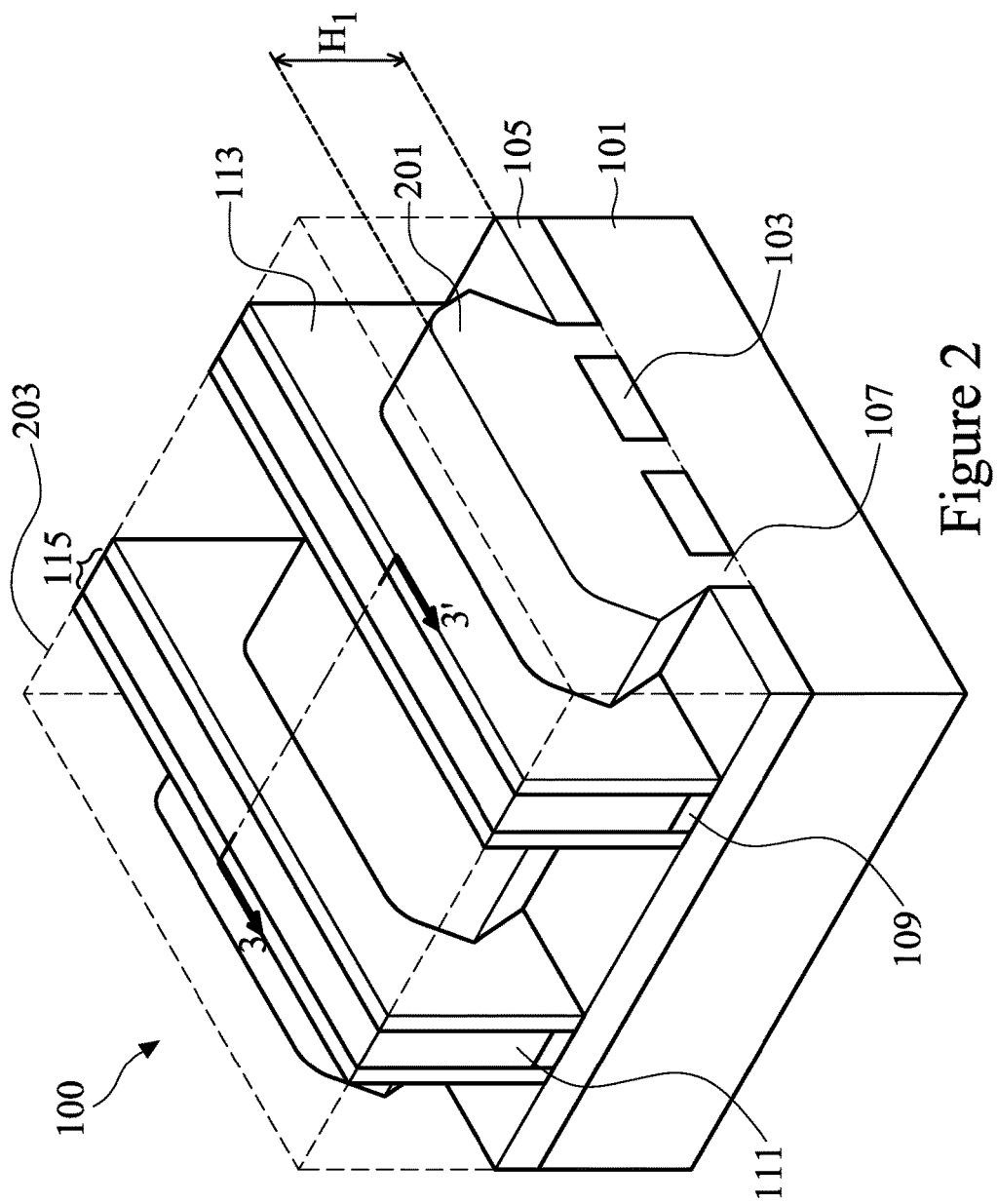
FIG. 2 illustrates formation of source/drain regions in accordance with some embodiments.

FIG. 2 illustrates a removal of the fins 107 from those areas not protected by the stacks 115 and the first spacers 113 and a regrowth of source/drain regions 201. The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrode 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

In an embodiment the source/drain regions 201 may be formed to have a thickness of between about 5 Å and about 1000 Å and a first height $H_1$ over the first isolation regions 105 of between about 10 Å and about 500 Å, such as about 200 Å. In this embodiment, the source/drain regions 201 may be formed to have a height above the upper surface of the first isolation regions 105 of between about 5 nm and about 250 nm, such as about 100 nm. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gate electrode 111 during the formation of the source/drain regions 201 is removed. In an embodiment the hard mask may be removed using, e.g., a wet or dry etching process that is selective to the material of the hard mask. However, any suitable removal process may be utilized.

FIG. 2 also illustrates a formation of an inter-layer dielectric (ILD) layer 203 (illustrated in dashed lines in FIG. 2 in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may alternatively be used. The ILD layer 203 may be formed to a thickness of between about 100 Å and about 3,000 Å. Once formed, the ILD layer 203 may be planarized with the first spacers 113 using, e.g., a planarization process such as chemical mechanical polishing process, although any suitable process may be utilized.

Figure 3:
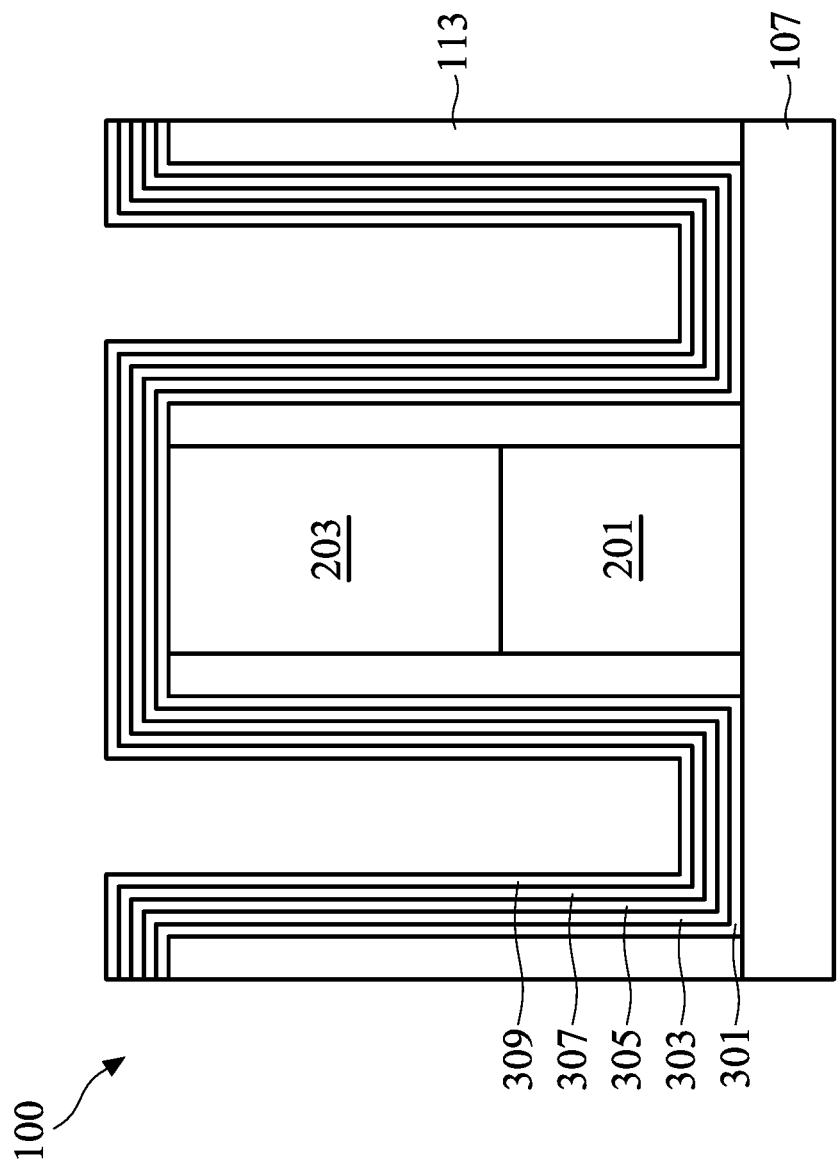
FIG. 3 illustrates a formation of a first opening and deposition of layers of a gate stack in accordance with some embodiments.

FIG. 3 illustrates a cross-sectional view of FIG. 2 along line 3-3' and also illustrates a removal and replacement of the material of the dummy gate electrode 111 and the dummy gate dielectric 109 with a plurality of layers for a gate stack 701 (not illustrated in FIG. 3 but illustrated and described below with respect to FIG. 7), including a first dielectric material 301, a first conductive layer 303, a first metal material 305, a work function layer 307, and a first barrier layer 309. In an embodiment the dummy gate electrode 111 and the dummy gate dielectric 109 may be removed using, e.g., a wet or dry etching process that utilizes etchants that are selective to the material of the dummy gate electrode 111 and the dummy gate dielectric 109. However, any suitable removal process may be utilized.

The first dielectric material 301 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material 301 may be deposited to a thickness of between about 5 Å and about 200 Å, although any suitable material and thickness may be utilized.

Optionally, an interfacial layer (not separately illustrated in FIG. 3) may be formed prior to the formation of the first dielectric material 301. In an embodiment the interfacial layer may be a material such as silicon dioxide formed through a process such as in situ steam generation (ISSG). However, any suitable material or process of formation may be utilized.

The first conductive layer 303 may be a metal silicide material such as titanium silicon nitride (TSN). In an embodiment the first conductive layer 303 may be formed using a deposition process such as chemical vapor deposition, although any suitable method of deposition, such as a deposition and subsequent silicidation, may be utilized to a thickness of between about 5 Å and about 30 Å. However, any suitable thickness may be utilized.

The first metal material 305 may be formed adjacent to the first dielectric material 301 as a barrier layer and may be formed from a metallic material such as TaN, Ti, TiAlN, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material 305 may be deposited using a deposition process such as atomic layer deposition, chemical vapor deposition, sputtering, or the like, to a thickness of between about 5 Å and about 200 Å, although any suitable deposition process or thickness may be used.

The work function layer 307 is formed over the first metal material 305, and the material for the work function layer 307 may be chosen based upon the type of device desired. Exemplary p-type work function metals that may be included include Al, TiAlC, TiN, TaN, Ru, Mo, WN, ZrSi$_2$, MoSi$_2$, TaSi$_2$, NiSi$_2$, WN, other suitable p-type work function materials, or combinations thereof. Exemplary n-type work function metals that may be included include Ti, Ag, TaAl, TaAlC, TiAlN, TaC, TaCN, TaSiN, Mn, Zr, other suitable n-type work function materials, or combinations thereof. A work function value is associated with the material composition of the work function layer 307, and thus, the material of the work function layer 307 is chosen to tune its work function value so that a desired threshold voltage Vt is achieved in the device that is to be formed in the respective region. The work function layer(s) may be deposited by CVD, PVD, and/or other suitable process to a thickness of between about 5 Å and about 50 Å.

The first barrier layer 309 may be formed adjacent to the work function layer 307 and, in a particular embodiment, may be similar to the first metal material 305. For example, the first barrier layer 309 may be formed from a metallic material such as TiN, Ti, TiAlN, TaC, TaCN, TaSiN, Mn, Zr, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the first barrier layer 309 may be deposited using a deposition process such as atomic layer deposition, chemical vapor deposition, sputtering, or the like, to a thickness of between about 5 Å and about 200 Å, although any suitable deposition process or thickness may be used.

Figure 4B:
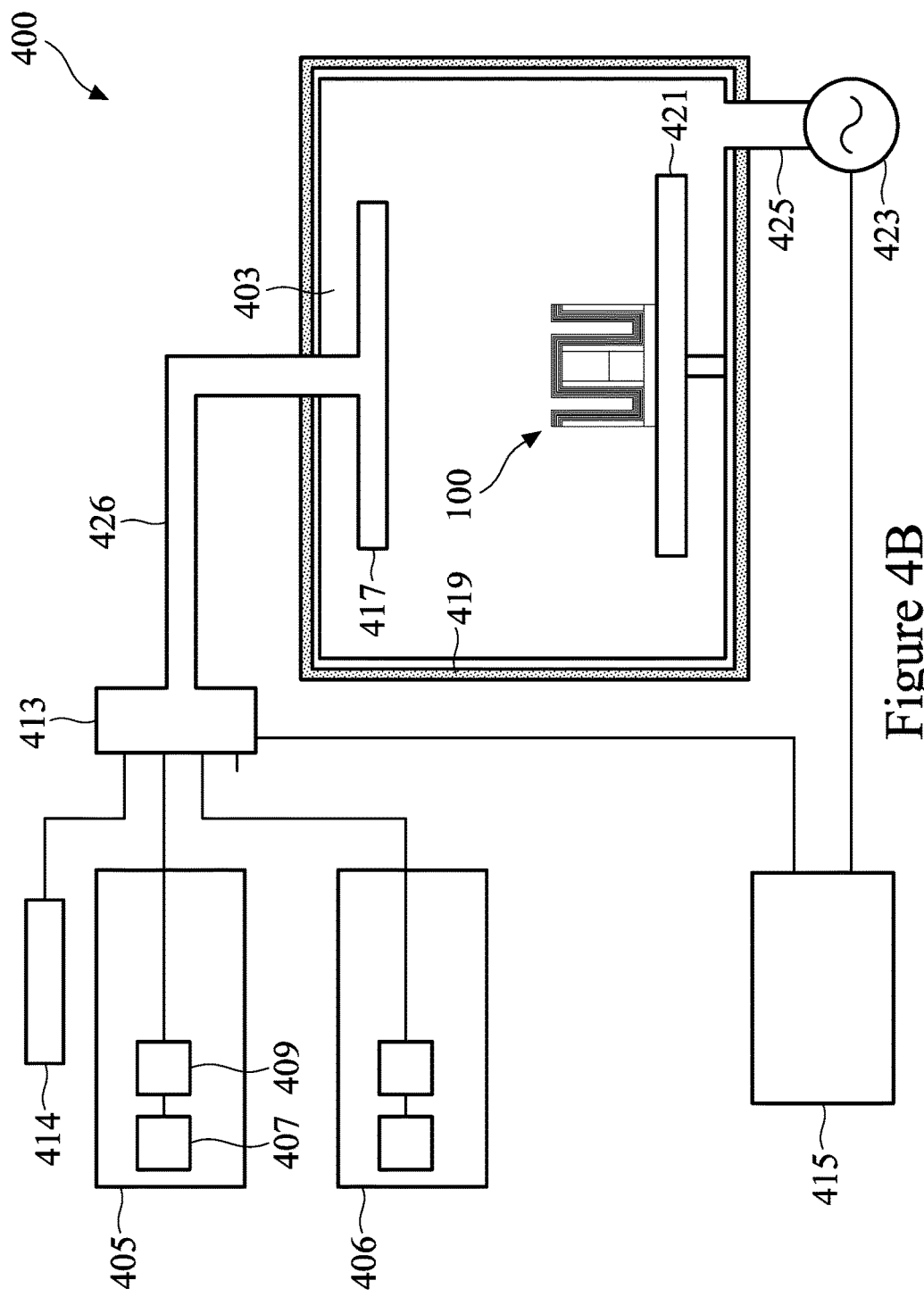
Figure 4C:
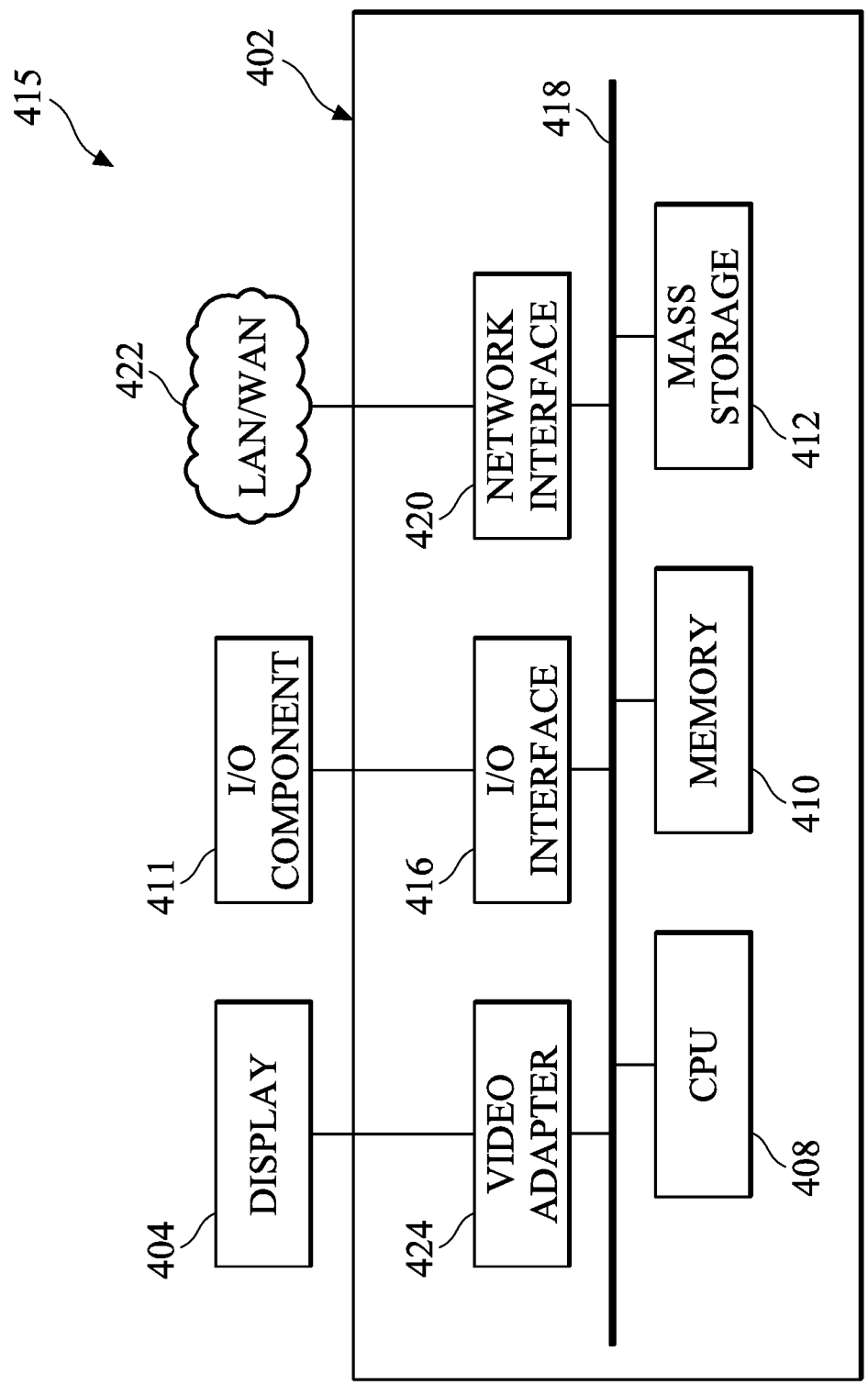

FIGS. 4A-4C illustrate a formation of a metal layer 401 over the first barrier layer 309, with FIG. 4A illustrating a cross-sectional view after formation of the metal layer 401 while FIGS. 4B-4C illustrate a deposition chamber that may be used in an embodiment to form the metal layer 401. In an embodiment the metal layer 401 may be a material that is both suitable for use as a seed layer to help a subsequent filling process as well as a material that can be used to help block or reduce the transport of fluorine atoms into the work function layer 307. In a particular embodiment, the metal layer 401 may be crystalline tungsten (W) that is formed free from the presence of fluorine atoms.

FIG. 4B illustrates a deposition system 400 that may be used to form the metal layer 401 using a conformal deposition process such as atomic layer deposition. In an embodiment the deposition system 400 receives precursor materials from a first precursor delivery system 405 and a second precursor delivery system 406 to form a series of monolayers of materials. In an embodiment the first precursor delivery system 405 and the second precursor delivery system 406 may work in conjunction with one another to supply the various different precursor materials to a deposition chamber 403 wherein the substrate 101 (and consequently the first barrier layer 309) are placed. However, the first precursor delivery system 405 and the second precursor delivery system 406 may have physical components that are similar with each other.

For example, the first precursor delivery system 405 and the second precursor delivery system 406 may each include a gas supply 407 and a flow controller 409 (labeled in FIG. 4B with regards to the first precursor delivery system 405 but not labeled for clarity with respect to the second precursor delivery system 406). In an embodiment in which the first precursor is stored in a gaseous state, the gas supply 407 may supply the first precursor to the deposition chamber 403. The gas supply 407 may be a vessel, such as a gas storage tank, that is located either locally to the deposition chamber 403 or else may be located remotely from the deposition chamber 403. Alternatively, the gas supply 407 may be a facility that independently prepares and delivers the first precursor to the flow controller 409. Any suitable source for the first precursor may be utilized as the gas supply 407, and all such sources are fully intended to be included within the scope of the embodiments.

The gas supply 407 may supply the desired precursor to the flow controller 409. The flow controller 409 may be utilized to control the flow of the precursor to the precursor gas controller 413 and, eventually, to the deposition chamber 403, thereby also helping to control the pressure within the deposition chamber 403. The flow controller 409 may be, e.g., a proportional valve, a modulating valve, a needle valve, a pressure regulator, a mass flow controller, combinations of these, or the like. However, any suitable method for controlling and regulating the flow may be utilized, and all such components and methods are fully intended to be included within the scope of the embodiments.

However, as one of ordinary skill in the art will recognize, while the first precursor delivery system 405 and the second precursor delivery system 406 have been described herein as having identical components, this is merely an illustrative example and is not intended to limit the embodiments in any fashion. Any type of suitable precursor delivery system, with any type and number of individual components identical to or different from any of the other precursor delivery systems within the deposition system 400, may alternatively be utilized. All such precursor systems are fully intended to be included within the scope of the embodiments.

Additionally, in an embodiment in which the first precursor is stored in a solid or liquid state, the gas supply 407 may store a carrier gas and the carrier gas may be introduced into a precursor canister (not separately illustrated), which stores the first precursor in the solid or liquid state. The carrier gas is then used to push and carry the first precursor as it either evaporates or sublimates into a gaseous section of the precursor canister before being sent to the precursor gas controller 413. Any suitable method and combination of units may be utilized to provide the first precursor, and all such combination of units are fully intended to be included within the scope of the embodiments.

The first precursor delivery system 405 and the second precursor delivery system 406 may supply their individual precursor materials into the precursor gas controller 413.

The precursor gas controller 413 connects and isolates the first precursor delivery system 405 and the second precursor delivery system 406 to and from the deposition chamber 403 in order to deliver the desired precursor materials to the deposition chamber 403. The precursor gas controller 413 may include such devices as valves, flow meters, sensors, and the like to control the delivery rates of each of the precursors, and may be controlled by instructions received from the control unit 415 (described further below with respect to FIG. 4C).

The precursor gas controller 413, upon receiving instructions from the control unit 415, may open and close valves so as to connect one of the first precursor delivery system 405 and the second precursor delivery system 406 to the deposition chamber 403 and direct a desired precursor material through a manifold 426, into the deposition chamber 403, and to a showerhead 417. The showerhead 417 may be utilized to disperse the chosen precursor material into the deposition chamber 403 and may be designed to evenly disperse the precursor material in order to minimize undesired process conditions that may arise from uneven dispersal. In an embodiment the showerhead 417 may have a circular design with openings dispersed evenly around the showerhead 417 to allow for the dispersal of the desired precursor material into the deposition chamber 403.

However, as one of ordinary skill in the art will recognize, the introduction of precursor materials to the deposition chamber 403 through a single showerhead 417 or through a single point of introduction as described above is intended to be illustrative only and is not intended to be limiting to the embodiments. Any number of separate and independent showerheads 417 or other openings to introduce precursor materials into the deposition chamber 403 may alternatively be utilized. All such combinations of showerheads and other points of introduction are fully intended to be included within the scope of the embodiments.

The deposition chamber 403 may receive the desired precursor materials and expose the precursor materials to the surface of the first barrier layer 309, and the deposition chamber 403 may be any desired shape that may be suitable for dispersing the precursor materials and contacting the precursor materials with the sidewalls of the surface of the first barrier layer 309. In the embodiment illustrated in FIG. 4B, the deposition chamber 403 has a cylindrical sidewall and a bottom. However, the deposition chamber 403 is not limited to a cylindrical shape, and any other suitable shape, such as a hollow square tube, an octagonal shape, or the like, may be utilized. Furthermore, the deposition chamber 403 may be surrounded by a housing 419 made of material that is inert to the various process materials. As such, while the housing 419 may be any suitable material that can withstand the chemistries and pressures involved in the deposition process, in an embodiment the housing 419 may be steel, stainless steel, nickel, aluminum, alloys of these, combinations of these, and like.

Within the deposition chamber 403 the substrate 101 may be placed on a mounting platform 421 in order to position and control the substrate 101 during the deposition processes. The mounting platform 421 may include heating mechanisms in order to heat the substrate 101 during the deposition processes. Furthermore, while a single mounting platform 421 is illustrated in FIG. 4B, any number of mounting platforms 421 may additionally be included within the deposition chamber 403.

Additionally, the deposition chamber 403 and the mounting platform 421 may be part of a cluster tool system (not shown). The cluster tool system may be used in conjunction with an automated handling system in order to position and place the substrate 101 into the deposition chamber 403 prior to the deposition processes, position, hold the substrate 101 during the deposition processes, and remove the substrate 101 from the deposition chamber 403 after the deposition processes.

The deposition chamber 403 may also have an exhaust outlet 425 for exhaust gases to exit the deposition chamber 403. A vacuum pump 423 may be connected to the exhaust outlet 425 of the deposition chamber 403 in order to help evacuate the exhaust gases. The vacuum pump 423, under control of the control unit 415, may also be utilized to reduce and control the pressure within the deposition chamber 403 to a desired pressure and may also be utilized to evacuate precursor materials from the deposition chamber 403 in preparation for the introduction of the next precursor material.

FIG. 4C illustrates an embodiment of the control unit 415 that may be utilized to control the precursor gas controller 413 and the vacuum pump 423 (as illustrated in FIG. 4B). The control unit 415 may be any form of computer processor that can be used in an industrial setting for controlling process machines. In an embodiment the control unit 415 may comprise a processing unit 402, such as a desktop computer, a workstation, a laptop computer, or a dedicated unit customized for a particular application. The control unit 415 may be equipped with a display 404 and one or more input/output components 411, such as instruction outputs, sensor inputs, a mouse, a keyboard, printer, combinations of these, or the like. The processing unit 402 may include a central processing unit (CPU) 408, memory 410, a mass storage device 412, a video adapter 424, and an I/O interface 416 connected to a bus 418.

The bus 418 may be one or more of any type of several bus architectures including a memory bus or memory controller, a peripheral bus, or video bus. The CPU 408 may comprise any type of electronic data processor, and the memory 410 may comprise any type of system memory, such as static random access memory (SRAM), dynamic random access memory (DRAM), or read-only memory (ROM). The mass storage device 412 may comprise any type of storage device configured to store data, programs, and other information and to make the data, programs, and other information accessible via the bus 418. The mass storage device 412 may comprise, for example, one or more of a hard disk drive, a magnetic disk drive, or an optical disk drive.

The video adapter 424 and the I/O interface 416 provide interfaces to couple external input and output devices to the processing unit 402. As illustrated in FIG. 4C, examples of input and output devices include the display 404 coupled to the video adapter 424 and the I/O component 411, such as a mouse, keyboard, printer, and the like, coupled to the I/O interface 416. Other devices may be coupled to the processing unit 402, and additional or fewer interface cards may be utilized. For example, a serial interface card (not shown) may be used to provide a serial interface for a printer. The processing unit 402 also may include a network interface 420 that may be a wired link to a local area network (LAN) or a wide area network (WAN) 422 and/or a wireless link.

It should be noted that the control unit 415 may include other components. For example, the control unit 415 may include power supplies, cables, a motherboard, removable storage media, cases, and the like. These other components, although not shown in FIG. 4C, are considered part of the control unit 415.

In an embodiment the formation of the metal layer 401 may be initiated by putting a first precursor material into the first precursor delivery system 405. For example, in an embodiment in which the metal layer 401 is tungsten (W), the first precursor material may be a precursor that is free from fluorine atoms, such as tungsten chloride (WCl$_x$), wherein X may be 4, 5, 6, and may be placed into the first precursor delivery system 405. However, as one of ordinary skill in the art will recognize, this precursor is not the only precursor that may be utilized to form a layer of tungsten, and the use of tungsten chloride is not intended to be limiting to the embodiments. Any suitable precursor material in any suitable phase (solid, liquid, or gas) to form a layer of tungsten that is free from fluorine that may be used to form other materials, may be utilized.

Additionally, a second precursor material may be placed into the second precursor delivery system 406. In the embodiment in which a layer of tungsten that is free from fluorine atoms is the desired material for the metal layer 401, the second precursor material may be a precursor material that contains hydrogen in order to react with the first precursor material to form a monolayer of tungsten without fluorine. For example, in the embodiment in which tungsten chloride (WCl$_5$) is utilized as the first precursor material, hydrogen (H$_2$) may be used as the second precursor material and may be placed into the second precursor delivery system 406. However, the description of hydrogen as the second precursor material is not intended to be limiting to the embodiments, and any other suitable precursor material, such as SiH$_4$/NH$_3$, combinations of these, or the like, may be utilized as the second precursor material.

Once the first precursor material and the second precursor material have been placed into the first precursor delivery system 405 and the second precursor delivery system 406, respectively, the formation of the metal layer 401 may be initiated by the control unit 415 sending an instruction to the precursor gas controller 413 to connect the first precursor delivery system 405 to the deposition chamber 403. Once connected, the first precursor delivery system 405 can deliver the first precursor material (e.g., the tungsten chloride (WCl$_5$)) to the showerhead 417 through the precursor gas controller 413 and the manifold 426. The showerhead 417 can then disperse the first precursor material into the deposition chamber 403, wherein the first precursor material can be adsorbed and react to the exposed surfaces of the first barrier layer 309.

In the embodiment to form a layer of tungsten free from fluorine atoms, the first precursor material may be flowed into the deposition chamber 403 at a flow rate of between about 0.1 standard liter per minute (slm) and about 1 slm for about 0.1~1 seconds per cycle. Additionally, the deposition chamber 403 may be held at a pressure of between about 5 torr and about 50 torr, such as about 20 torr, and a temperature of between about 400° C. and about 500° C., such as about 450° C. However, as one of ordinary skill in the art will recognize, these process conditions are only intended to be illustrative, as any suitable process conditions may be utilized while remaining within the scope of the embodiments.

As the first precursor material is adsorbed onto the surfaces of the first barrier layer 309, the first precursor material will react with open active sites located on the exposed surfaces. However, once all of the open active sites on the exposed surfaces have reacted with the first precursor material, the reaction will stop, as there are no more open active sites to which the first precursor material will bond. This limitation causes the reaction of the first precursor material with the exposed surfaces of the first barrier layer 309 to be self-limiting and to form a monolayer of the reacted first precursor material on the surfaces of the first barrier layer 309, thereby allowing for a more precise control of the thickness of the metal layer 401.

After the self-limiting reaction has finished, the deposition chamber 403 may be purged of the first precursor material. For example, the control unit 415 may instruct the precursor gas controller 413 to disconnect the first precursor delivery system 405 (containing the first precursor material to be purged from the deposition chamber 403) and to connect a purge gas delivery system 414 to deliver a purge gas to the deposition chamber 403. In an embodiment the purge gas delivery system 414 may be a gaseous tank or other facility that provides a purge gas such as nitrogen, argon, xenon, or other non-reactive gas to the deposition chamber 403. Additionally, the control unit 415 may also initiate the vacuum pump 423 in order to apply a pressure differential to the deposition chamber 403 to aid in the removal of the first precursor material. The purge gas, along with the vacuum pump 423, may purge the first precursor material from the deposition chamber 403 for about 3 seconds.

After the purge of the first precursor material has been completed, the introduction of the second precursor material (e.g., hydrogen) to the deposition chamber 403 may be initiated by the control unit 415 sending an instruction to the precursor gas controller 413 to disconnect the purge gas delivery system 414 and to connect the second precursor delivery system 406 (containing the second precursor material) to the deposition chamber 403. Once connected, the second precursor delivery system 406 can deliver the second precursor material to the showerhead 417. The showerhead 417 can then disperse the second precursor material into the deposition chamber 403, wherein the second precursor material can be adsorbed on the exposed surfaces of the first barrier layer 309 and react with the first precursor material in another self-limiting reaction to form a monolayer of the desired material, e.g., tungsten free from fluorine, on the exposed surfaces of the first barrier layer 309.

In the embodiment discussed above to form a layer of tungsten with tungsten chloride, the hydrogen may be introduced into the deposition chamber 403 at a flow rate of between about 1 slm and about 8 slm, such as about 6 slm, for about 0.1~1.5 seconds. Additionally, the deposition chamber 403 may be held at a pressure of between about 5 torr and about 50 torr and a temperature of between about 400° C. and about 500° C. However, as one of ordinary skill in the art will recognize, these process conditions are only intended to be illustrative, as any suitable process conditions may be utilized to introduce hydrogen while remaining within the scope of the embodiments.

After the monolayer of the desired material, e.g., tungsten, has been formed, the deposition chamber 403 may be purged (leaving behind the monolayer of the desired material on the exposed surfaces of the first barrier layer 309) using, e.g., a purge gas from the purge gas delivery system 414 for about three seconds. After the deposition chamber 403 has been purged, a first cycle for the formation of the desired material has been completed, and a set of chemical equations that may describe the chemical processes used in the atomic layer deposition process may be seen below as equations 1 and 2:

$$WCl_x^* + H_2 \rightarrow W\text{---}H^* + HCl$$

$$W\text{---}H^* + WCl_5 \rightarrow W\text{---}WCl_x^* + HCl$$

Once the first cycle has been finished, a second cycle similar to the first cycle may be started. For example, the repeated cycle may introduce the first precursor material, purge with the purge gas, pulse with the second precursor, and purge with the purge gas. These cycles may be repeated until the metal layer 401 has a thickness of between about 20 Å and about 50 Å, such as between about 30 Å and about 40 Å. Once the desired thickness of the metal layer 401 has been reached, the substrate 101 may be removed from the deposition chamber 403 for further processing.

However, as one of ordinary skill in the art will recognize, the above described process to form the metal layer 401 is intended to be illustrative and is not intended to be limiting to the embodiments. Any other suitable process, such as initially pulsing the second precursor material (e.g., hydrogen), purging with the purge gas, introducing the first precursor material (e.g., tungsten chloride), and purging with the purge gas to complete a first cycle and then repeating the first cycle, may be utilized. This and any other suitable process to form the metal layer 401 are fully intended to be included within the scope of the embodiments.

By utilizing a precursor materials such as tungsten chloride that does not utilize fluorine atoms, the metal layer 401 may be formed without residual fluorine being incorporated from the deposition process while still allowing later depositions to use fluorine based precursor that are cheaper and quicker. In particular, the tungsten chloride may be formed with a fluorine concentration of about zero. As such, if subsequently formed layers do contain residual fluorine atoms from their individual deposition processes, the metal layer 401 may act as a barrier layer and prevent the fluorine from diffusing further into the work function layer 307 and interfering with the operation of the metal gate.

Figure 5:
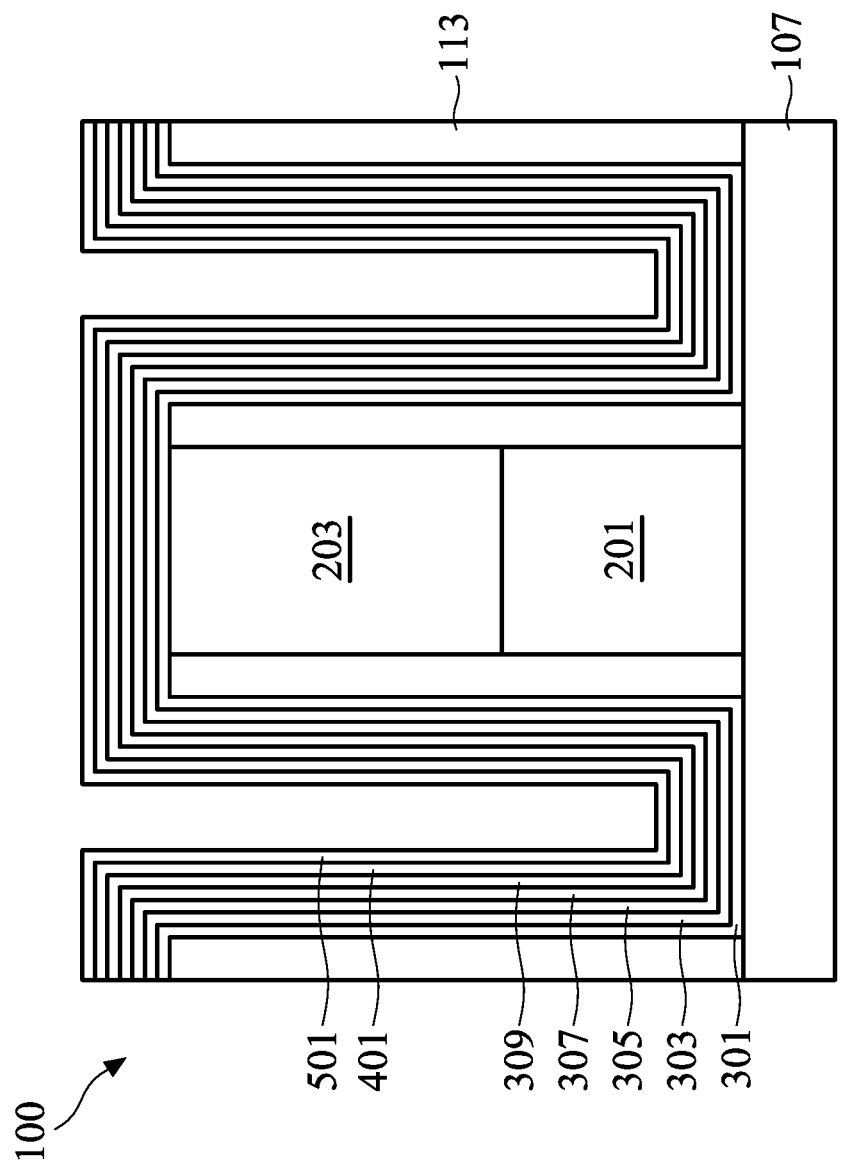
FIG. 5 illustrates a formation of a nucleation layer in accordance with some embodiments.

FIG. 5 illustrates that, once the metal layer 401 has been formed, a nucleation layer 501 may be formed over the metal layer 401 in order to provide a nucleation point for a subsequent fill material 601 (not illustrated in FIG. 5 but illustrated and discussed below with respect to FIG. 6). In an embodiment the nucleation layer 501 may be the same material as the metal layer 401 (e.g., tungsten), may be formed using a similar process (e.g., ALD), but may be deposited without fluorine free precursors. Additionally, while the metal layer 401 may be a crystalline (e.g., crystalline tungsten), the nucleation layer 501 may be formed to be an amorphous material, such as amorphous tungsten.

The nucleation layer 501 may be formed using a process similar to the formation of the metal layer 401, such as an atomic layer deposition process. Additionally, the nucleation layer 501 may be formed either within the same deposition system 400 as the metal layer 401 (using, e.g., a third precursor delivery system (not separately illustrated), a fourth precursor delivery system (not separately illustrated), and a fifth precursor delivery system (also not separately illustrated), or may be a separate deposition system using similar, but not necessarily the same, equipment as described. As such, for the convenience of this discussion, the following discussion is described in terms of the deposition system 400 above, it should be understood that the discussion is not limited to the same deposition system as was used to deposit the metal layer 401.

In a particular embodiment the formation of the nucleation layer 501 may be initiated by putting a first nucleation precursor material into the first precursor delivery system 405. For example, in an embodiment in which the metal layer 401 is tungsten (W), the first nucleation precursor material may be a precursor such as silane ($SiH_4$) and may be placed into the first precursor delivery system 405. However, as one of ordinary skill in the art will recognize, this precursor is not the only precursor that may be utilized to form a layer of tungsten, and the use of silane is not intended to be limiting to the embodiments. For example, the first nucleation precursor material may be a material such as diborane ($B_2H_6$). Any suitable precursor material in any suitable phase (solid, liquid, or gas) to form a layer of tungsten may be used.

Additionally, a second nucleation precursor material may be placed into the second precursor delivery system 406. In the embodiment in which a layer of tungsten is the desired material for the nucleation layer, the second nucleation precursor material may be a precursor material that contains tungsten in order to react with the first precursor material to form a monolayer of tungsten. For example, in the embodiment in which silane ($SiH_4$) is utilized as the first nucleation precursor material, tungsten fluoride ($WF_6$) may be used as the second nucleation precursor material and may be placed into the second precursor delivery system 406. However, any other suitable precursor material or combinations of materials may be utilized as the second nucleation precursor material.

Once the first nucleation precursor material and the second nucleation precursor material have been placed into the first precursor delivery system 405 and the second precursor delivery system 406, respectively, the formation of the nucleation layer 501 may be initiated by the control unit 415 sending an instruction to the precursor gas controller 413 to connect the first precursor delivery system 405 to the deposition chamber 403. Once connected, the first precursor delivery system 405 can deliver the first nucleation precursor material (e.g., the silane) to the showerhead 417 through the precursor gas controller 413 and the manifold 426. The showerhead 417 can then disperse the first nucleation precursor material into the deposition chamber 403, wherein the first nucleation precursor material can be adsorbed and react to the exposed surfaces of the metal layer 401.

In the embodiment to form a layer of tungsten as the nucleation layer 501, the first nucleation precursor material may be flowed into the deposition chamber 403 at a flow rate of between about 0.1 slm and about 1 slm for about 1~3 seconds per cycle. Additionally, the deposition chamber 403 may be held at a pressure of between about 2 torr and about 10 torr, such as about 5 torr, and a temperature of between about 200° C. and about 400° C., such as about 300° C. However, as one of ordinary skill in the art will recognize, these process conditions are only intended to be illustrative, as any suitable process conditions may be utilized while remaining within the scope of the embodiments.

As the first nucleation precursor material is adsorbed onto the surfaces of the metal layer 401, the first nucleation precursor material will react with open active sites located on the exposed surfaces. However, once all of the open active sites on the exposed surfaces have reacted with the first nucleation precursor material, the reaction will stop, as there are no more open active sites to which the first nucleation precursor material will bond. This limitation causes the reaction of the first nucleation precursor material with the exposed surfaces of the metal layer 401 to be self-limiting and to form a monolayer of the reacted first nucleation precursor material on the surfaces of the metal layer 401, thereby allowing for a more precise control of the thickness of the nucleation layer 501.

After the self-limiting reaction has finished, the deposition chamber 403 may be purged of the first nucleation precursor material. For example, the control unit 415 may instruct the precursor gas controller 413 to disconnect the first precursor delivery system 405 (containing the first nucleation precursor material to be purged from the deposition chamber 403) and to connect the purge gas delivery system 414 to deliver the purge gas to the deposition chamber 403. Additionally, the control unit 415 may also initiate the vacuum pump 423 in order to apply a pressure differential to the deposition chamber 403 to aid in the removal of the first nucleation precursor material. The purge gas, along with the vacuum pump 423, may purge the first nucleation precursor material from the deposition chamber 403 for about 3 seconds.

After the purge of the first nucleation precursor material has been completed, the introduction of the second nucleation precursor material (e.g., tungsten fluoride) to the deposition chamber 403 may be initiated by the control unit 415 sending an instruction to the precursor gas controller 413 to disconnect the purge gas delivery system 414 and to connect the second precursor delivery system 406 (containing the second nucleation precursor material) to the deposition chamber 403. Once connected, the second precursor delivery system 406 can deliver the second nucleation precursor material to the showerhead 417. The showerhead 417 can then disperse the second nucleation precursor material into the deposition chamber 403, wherein the second nucleation precursor material can be adsorbed on the exposed surfaces of the metal layer 401 and react with the first nucleation precursor material in another self-limiting reaction to form a monolayer of the desired material, e.g., tungsten, on the exposed surfaces of the metal layer 401.

In the embodiment discussed above to form a layer of tungsten, the tungsten fluoride may be introduced into the deposition chamber 403 at a flow rate of between about 0.01 slm and about 0.2 slm, such as about 0.1 slm, for about 1~3 seconds. Additionally, the deposition chamber 403 may be held at a pressure of between about 2 torr and about 10 torr and a temperature of between about 200° C. and about 400° C. However, as one of ordinary skill in the art will recognize, these process conditions are only intended to be illustrative, as any suitable process conditions may be utilized to introduce the tungsten fluoride while remaining within the scope of the embodiments.

After the monolayer of the desired material, e.g., tungsten, has been formed, the deposition chamber 403 may be purged (leaving behind the monolayer of the desired material on the exposed surfaces of the metal layer 401) using, e.g., the purge gas from the purge gas delivery system 414 for about three seconds. After the deposition chamber 403 has been purged, a first cycle for the formation of the desired material has been completed, and a second cycle similar to the first cycle may be started. For example, the repeated cycle may introduce the first nucleation precursor material, purge with the purge gas, pulse with the second nucleation precursor material, and purge with the purge gas. These cycles may be repeated until the nucleation layer 501 has a thickness of between about 20 Å and about 40 Å. Once the desired thickness of the nucleation layer 501 has been reached, the substrate 101 may be removed from the deposition chamber 403 for further processing.

However, as one of ordinary skill in the art will recognize, the above described process to form the nucleation layer 501 is intended to be illustrative and is not intended to be limiting to the embodiments. Any other suitable process, such as initially pulsing the second nucleation precursor material (e.g., tungsten fluoride), purging with the purge gas, introducing the first nucleation precursor material (e.g., silane or diborane), and purging with the purge gas to complete a first cycle and then repeating the first cycle, may be utilized. This and any other suitable process to form the nucleation layer 501 are fully intended to be included within the scope of the embodiments.

Figure 6:
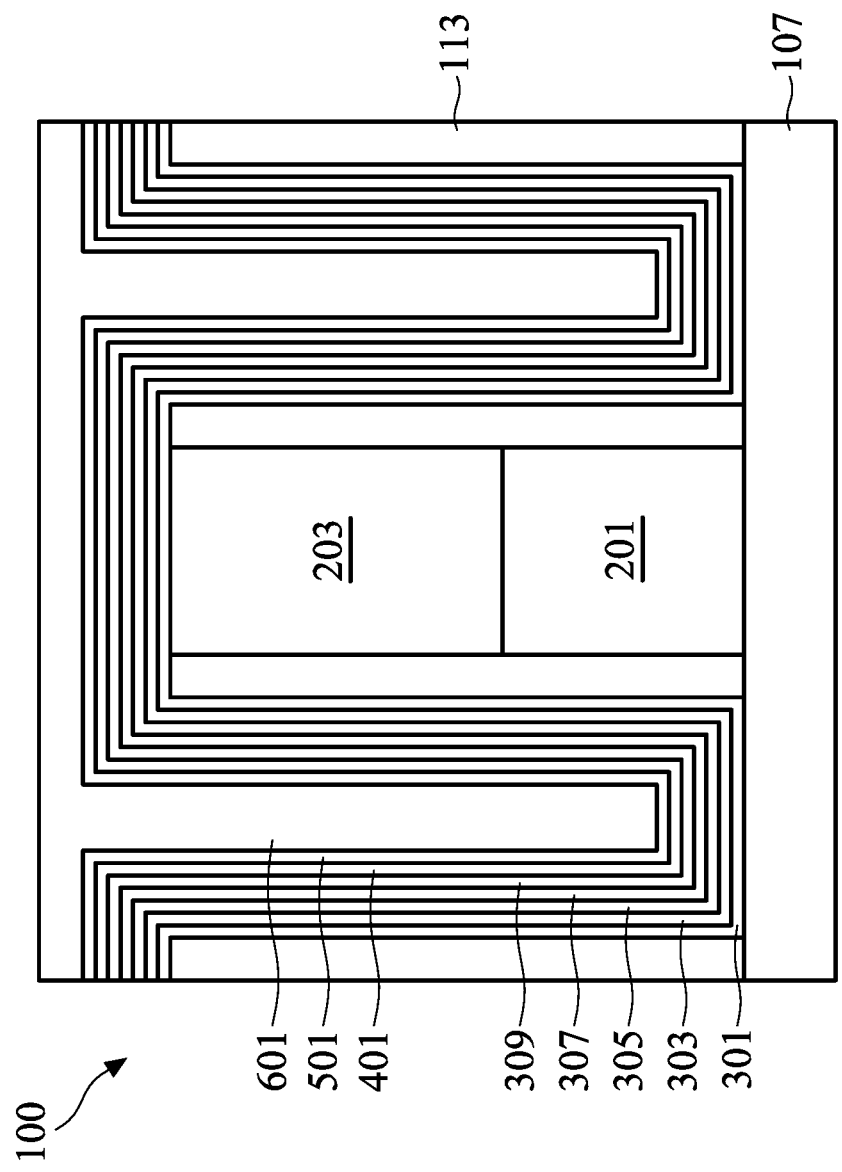
FIG. 6 illustrates a deposition of a fill material in accordance with some embodiments.

FIG. 6 illustrates that, once the nucleation layer 501 has been formed, a fill material 601 is deposited to fill a remainder of the opening using the nucleation layer 501 to help nucleate the fill material 601. In an embodiment the fill material 601 may be the same material as the nucleation layer 501 (e.g., tungsten) or may be a different material, such as Al, Cu, AlCu, W, Ti, TiAlN, TaC, TaCN, TaSiN, Mn, Zr, TiN, Ta, TaN, Co, Ni, combinations of these, or the like, to a thickness of between about 1000 Å and about 2000 Å, such as about 1500 Å. However, any suitable material may be utilized.

Additionally, the fill material 601 may be deposited using a deposition process such as a non-conformal deposition process such as chemical vapor deposition. In an embodiment the deposition process may utilize precursors such as tungsten fluoride ($WF_6$) and hydrogen ($H_2$), although any suitable precursors may be utilized. In a particular embodiment using tungsten fluoride and hydrogen as the precursors, the tungsten fluoride may be flowed into a reaction chamber at a flow rate of between about 0.1 slm and about 0.5 slm, such as about 0.3 slm, while the hydrogen may be flowed in at the same time at a flow rate of between about 1 slm and about 10 slm, such as about 6 slm. Additionally, the chemical vapor deposition process may be performed at a temperature of between about 200° C. and about 400° C., such as about 300° C., and at a pressure of between about 100 torr and about 400 torr, such as about 250 torr. However, any suitable process conditions may be utilized.

Figure 7:
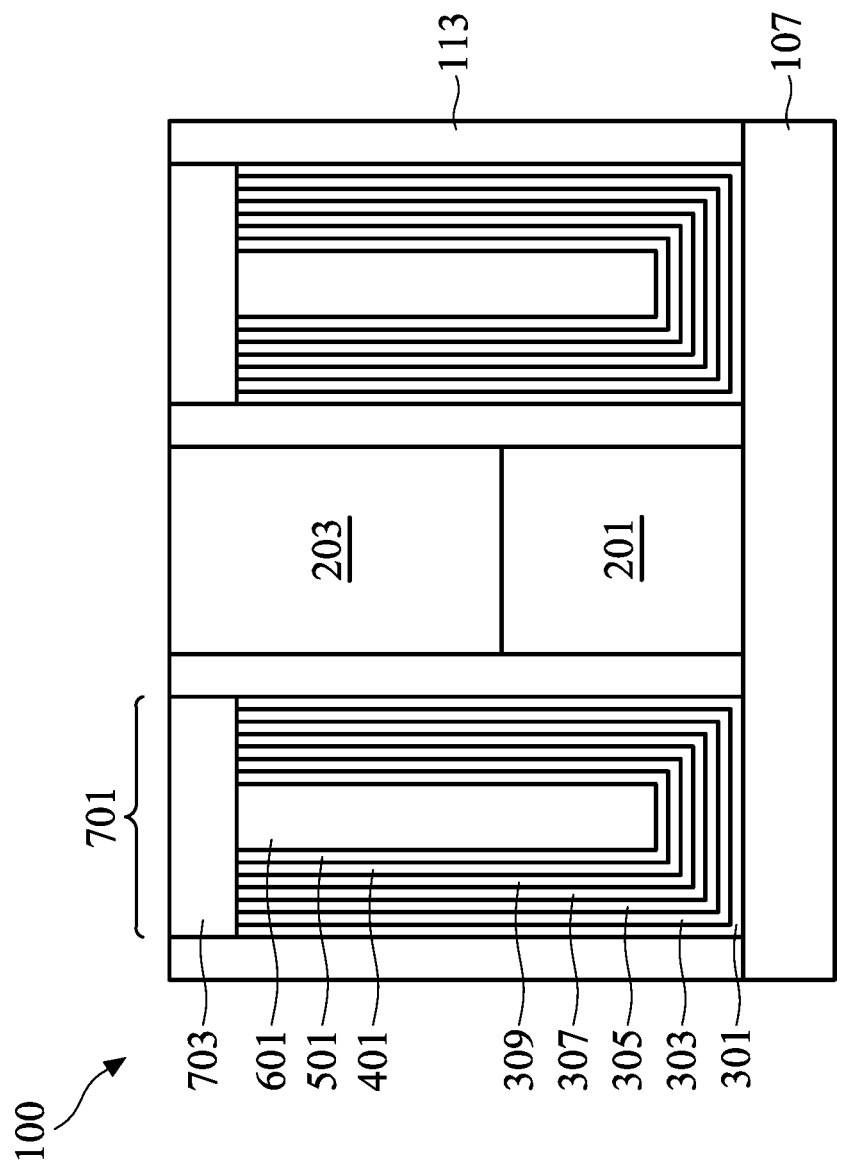
FIG. 7 illustrates a formation of a capping layer in accordance with some embodiments.

FIG. 7 illustrates that, after the fill material 601 has been deposited to fill and overfill the opening, the materials of the first dielectric material 301, first conductive layer 303, first metal material 305, work function layer 307, first barrier layer 309, metal layer 401, nucleation layer 501, fill material 601 may be planarized to form the gate stack 701. In an embodiment the materials may be planarized with the first spacers 113 using, e.g., a chemical mechanical polishing process, although any suitable process, such as grinding or etching, may be utilized.

After the materials of the gate stack 701 have been formed and planarized, the materials of the gate stack 701 may be recessed and capped with a capping layer 703. In an embodiment the materials of the gate stack 701 may be recessed using, e.g., a wet or dry etching process that utilizes etchants selective to the materials of the gate stack 701. In an embodiment the materials of the gate stack 701 may be recessed a distance of between about 5 nm and about 150 nm, such as about 120 nm. However, any suitable process and distance may be utilized.

Once the materials of the gate stack 701 have been recessed, the capping layer 703 may be deposited and planarized with the first spacers 113. In an embodiment the capping layer 703 is a material such as SiN, SiON, SiCON, SiC, SiOC, combinations of these, or the like, deposited using a deposition process such as atomic layer deposition, chemical vapor deposition, sputtering, or the like. The capping layer 703 may be deposited to a thickness of between about 5 Å and about 200 Å, and then planarized using a planarization process such as chemical mechanical polishing such that the capping layer 703 is planar with the first spacers 113.

Figure 8:
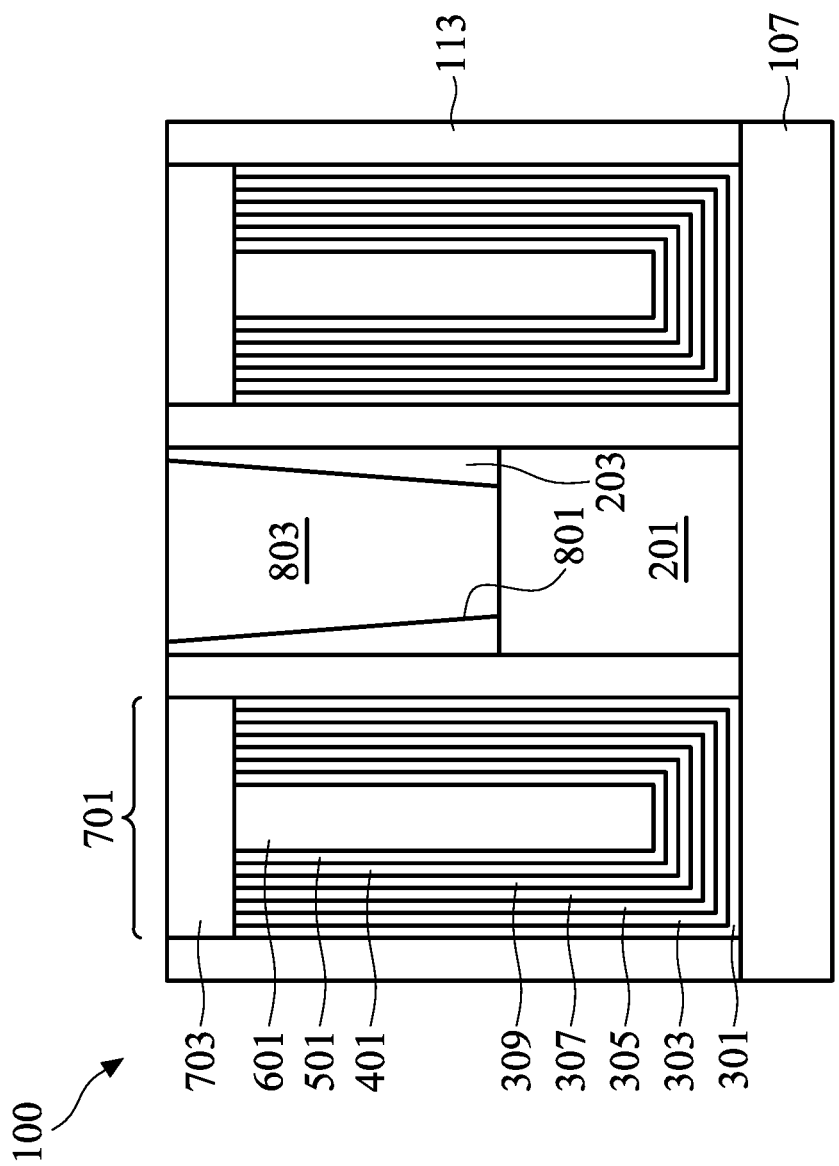
FIG. 8 illustrates formation of a first contact in accordance with some embodiments.

FIG. 8 illustrates a formation of a first opening 801 through the ILD layer 203 in order to expose the source/drain regions 201 in preparation for formation of a first contact 803. In an embodiment the first opening 801 may be formed by initially placing and patterning a first photoresist (not separately illustrated) over the source/drain regions 201 and then using the first photoresist as a mask with an etching process to form the first opening 801. However, any suitable type of photosensitive material or combination of materials may be utilized.

Optionally, a silicide contact (not illustrated) may be formed and then the first opening 801 may be filled to form the first contact 803. The silicide contact may comprise titanium, nickel, cobalt, or erbium in order to reduce the Schottky barrier height of the contact. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. The thickness of the silicide contact may be between about 5 nm and about 50 nm.

In an embodiment the first contact 803 may be a conductive material such as W, Al, Cu, AlCu, W, TaC, TaCN, TaSiN, Mn, Zr, TiN, Ta, TaN, Co, Ni, Ti, TiAlN, Ru, Mo, or WN, although any suitable material, such as aluminum, copper, alloys of these, combinations of these, or the like, and may be deposited into the first opening 801 using a deposition process such as sputtering, chemical vapor deposition, electroplating, electroless plating, or the like, to fill and/or overfill the first opening 801. Once filled or overfilled, any deposited material outside of the first opening 801 may be removed using a planarization process such as chemical mechanical polishing (CMP), and the first contact 803 may have a thickness of between about 5 Å and about 2000 Å. However, any suitable material and process of formation may be utilized.

Figure 9:
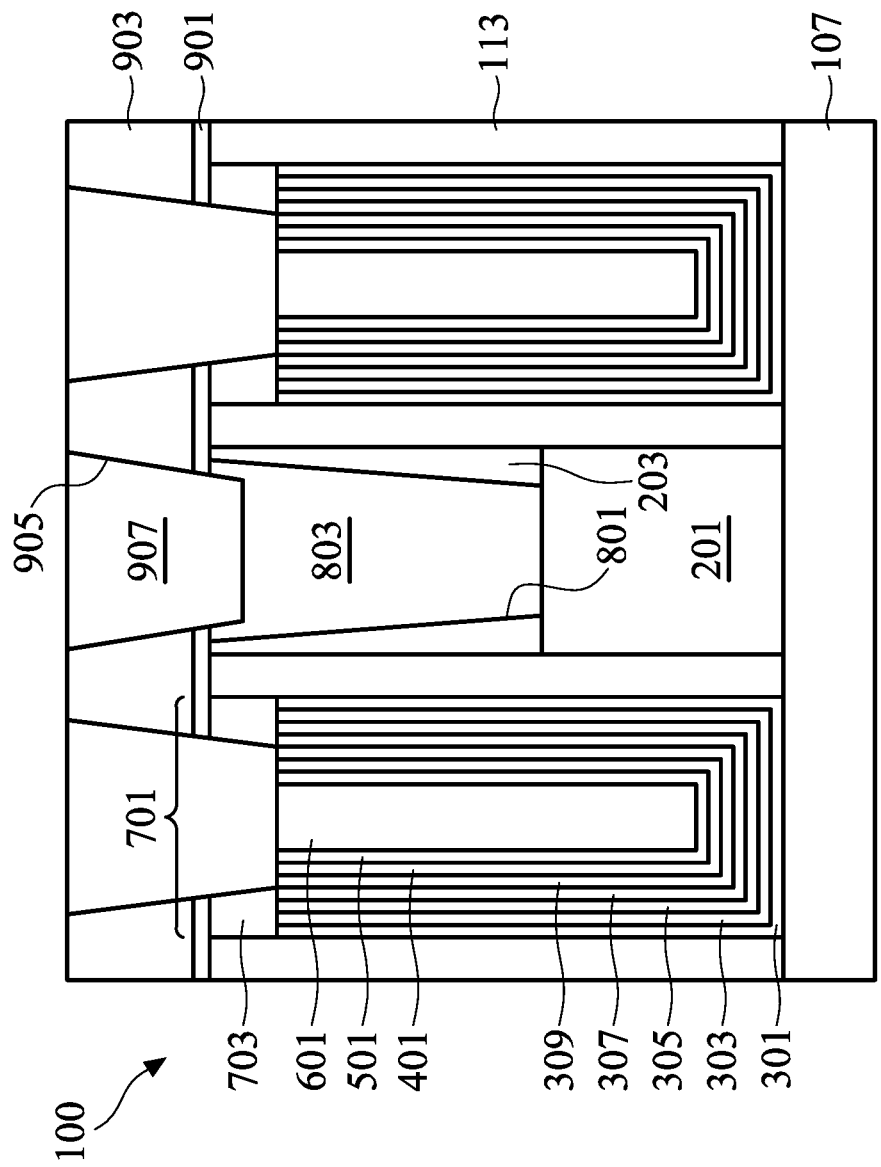
FIG. 9 illustrates a formation of second contacts in accordance with some embodiments.

FIG. 9 illustrates a formation of a first etch stop layer 901 over the gate stacks 701. In one embodiment, the first etch stop layer 901 may be formed of silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and alternative techniques of forming the first etch stop layer 901, such as low pressure CVD (LPCVD), PVD, or the like, could alternatively be used. The first etch stop layer 901 may have a thickness of between about 5 Å and about 500 Å.

FIG. 9 also illustrates a formation of a first dielectric layer 903 over the first etch stop layer 901. The first dielectric layer 903 may be made of one or more suitable dielectric materials such as low-k dielectrics such as carbon doped oxides, extremely low-k dielectrics such as porous carbon doped silicon dioxide, silicon oxide, silicon nitride, a polymer such as polyimide, combinations of these, or the like. The first dielectric layer 903 may be formed through a process such as a spin-on process or a chemical vapor deposition (CVD), although any suitable process may be utilized, and may have a thickness of between about 5 Å and about 500 Å, such as about 50 Å.

FIG. 9 also illustrates a patterning of both the first dielectric layer 903 and the first etch stop layer 901 to form second openings 905 that expose the first contact 803 and the gate stack 701. In an embodiment the first dielectric layer 903 and the first etch stop layer 901 may be patterned by initially placing and patterning a second photoresist over the first dielectric layer 903 and then using the second photoresist as a mask during one or more etching processes in order to expose the first contact 803 and the gate stack 701. Additionally, after the first etch stop layer 901 has been opened, the etching may either be stopped without extending into the first contact 803 or else may be continued to slightly overetch and form the second opening 905 to extend partially into the first contact 803.

Once the first contact 803 and the gate stack 701 have been exposed, a conductive material may be deposited to fill and/or overfill the second openings 905 to make electrical connection with the first contact 803 and the gate stack 701. In an embodiment the second contact 907 may be a conductive material such as tungsten (W), although any suitable material, such as aluminum, copper, alloys of these, combinations of these, or the like, and may be deposited using a deposition process such as sputtering, chemical vapor deposition, electroplating (with a seed layer), electroless plating, or the like, to fill and/or overfill the second openings 905. Once filled or overfilled, any deposited material outside of the second openings 905 may be removed using a planarization process such as chemical mechanical polishing (CMP).

However, while a single process to form the second contacts 907 has been described, one of ordinary skill in the art will understand that other suitable processes may also be utilized. For example, a first process to form openings and one of the second contacts 907 to make electrical connection to the first contact 803 may be performed separately from a second process to form the openings and one of the second contacts 907 to the gate stack 701. Any suitable number of processes may be utilized to form the second contacts 907.

Once the second contacts 907 have been formed, the semiconductor device 100 is ready for additional processing. In some embodiments the additional processing may include forming one or more metallization layers over the second contact 907 in order to form functional circuitry, forming contact pads in electrically connection with the metallization layer, and packaging the semiconductor device 100 so that the semiconductor device 100 may be attached to other external devices.

By forming the metal layer 401 to be free from fluorine, the metal layer 401 may act as a barrier layer to block the movement of any residual fluorine that may be present within the nucleation layer 501 or the fill material 601. As such, this residual fluorine is prevented from being introduced to the work function layer 307, thereby reducing or preventing poisoning and degradation of performance from this fluorine and maintaining a lower resistivity. Additionally, without the fluorine entering the work function layer 307, additional atoms from the material of the work function layer 307 (e.g., aluminum) may diffuse towards the interface between the first conductive layer 303 and the gate dielectric material 301 (e.g., $HfO_2$). As such, a more efficient and controlled device may be obtained.

Figure 10B:
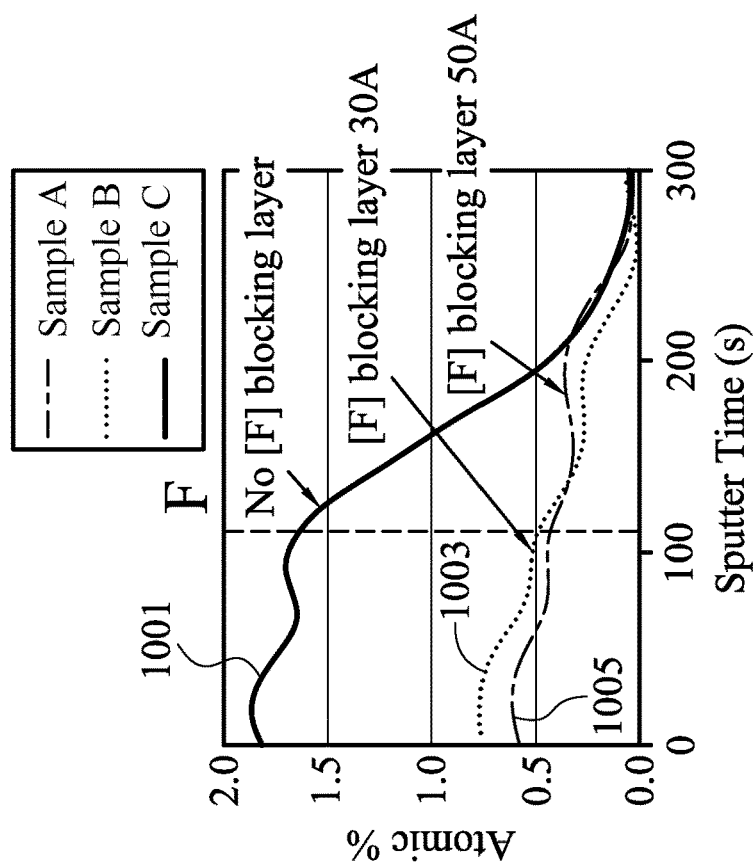
FIGS. 10A-10B illustrate charts of chlorine and fluorine in accordance with some embodiments.
Figure 10A:
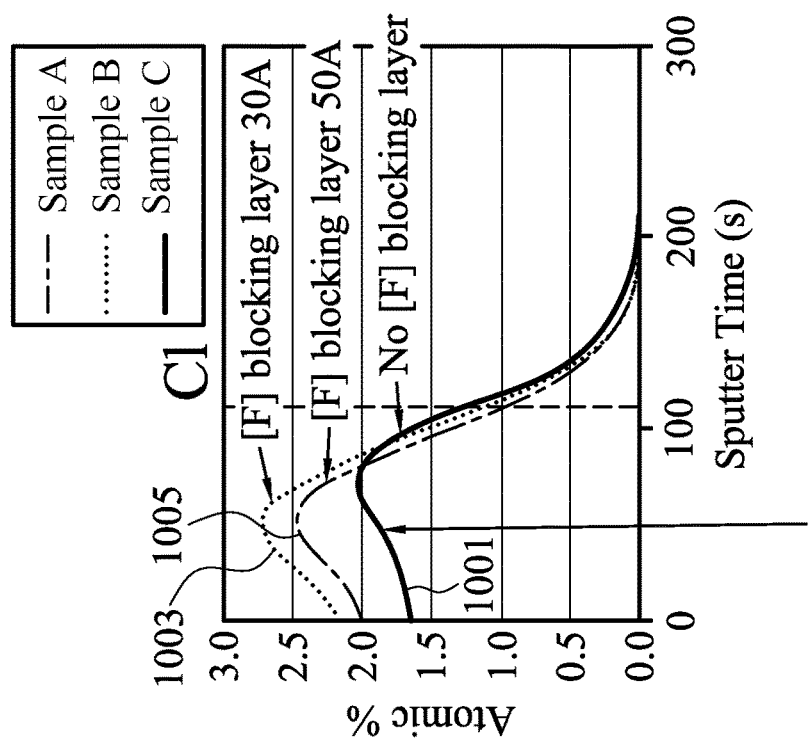

FIGS. 10A-10B illustrate charts of relative atomic percentages of chlorine by-product (in FIG. 10A) and fluorine by-product (in FIG. 10B) that have diffused into the work function layer 307 for embodiments in which the metal layer 401 is not present (labeled 1001), an embodiment in which the metal layer 401 has a thickness of 30 Å (labeled 1003), and an embodiment in which the metal layer 401 has a thickness of 50 Å (labeled 1005). These charts were generated using an XPS analysis performed with 200 μm monochromatic Al K-alpha X-ray, PE 100 eV and 0.2 eV step extracted with a 1 kV argon ion sputter. As can be seen in these figures, in embodiments in which the metal layer 401 is not present, there is an increased percentage of fluorine (and, accordingly, of fluorine poisoning) while there is a decreased percentage of chlorine. Similarly, both embodiments in which the metal layer 401 is present, there is a decreased percentage of fluorine (e.g., between about 0.1%-atomic to about 1.5%-atomic, such as about equal to or less than about 0.5%-atomic) and an increased percentage of chlorine.

In accordance with an embodiment, a method includes depositing a work function layer over a substrate; depositing a barrier layer over the work function layer; depositing a fluorine-free metal layer over the barrier layer; depositing a first metal layer over the fluorine-free metal layer; and depositing a second metal layer over the first metal layer to form a gate stack. In an embodiment the depositing the second metal layer comprises a fluorine-metal precursor. In an embodiment the fluorine-free metal layer comprises tungsten (W). In an embodiment the first metal layer and the second metal layer comprise W. In an embodiment the depositing the fluorine-free metal layer utilizes a fluorine-free precursor that also comprises tungsten. In an embodiment the fluorine-free precursor is tungsten chloride.

In accordance with another embodiment, a method includes depositing a work function layer over a substrate, the work function layer comprising aluminum; depositing a barrier layer over the work function layer, the barrier layer comprising titanium nitride; using a first fluorine-free atomic layer deposition process, depositing a first metal layer over the barrier layer; depositing a second metal layer over the first metal layer, wherein the depositing the second metal layer is performed at least in part with a second atomic layer deposition process; and using a fluorine-metal precursor, depositing a third metal layer over the second metal layer, wherein the depositing the third metal layer is performed at least in part with a chemical vapor deposition process. In an embodiment the first metal layer, the second metal layer, and the third metal layer comprise tungsten (W). In an embodiment the fluorine-metal precursor comprises W and fluorine. In an embodiment the first fluorine-free atomic layer deposition process uses tungsten chloride. In an embodiment the second atomic layer deposition process utilizes silane. In an embodiment the second atomic layer deposition process utilizes diborane. In an embodiment the first fluorine-free atomic layer deposition process forms the first metal layer as a crystalline material and wherein the depositing the second metal layer forms the second metal layer as an amorphous material. In an embodiment the method further includes planarizing the third metal layer with first spacers.

In yet another embodiment a device includes a high-K dielectric layer over a substrate; a first barrier layer over the high-K dielectric layer; a work function layer over the high-K dielectric layer, wherein the work function layer has a fluorine concentration of between about 0.1%-atomic and about 1.5%-atomic; a second barrier layer over the work function layer; a conductive layer over the second barrier layer; a first metal layer over the conductive layer, the first metal layer comprising a fluorine by-product; and a second metal layer over the first metal layer, the second metal layer comprising a fluorine by-product. In an embodiment the conductive layer comprises a plurality of monolayers. In an embodiment the first metal layer comprises a plurality of monolayers. In an embodiment the conductive layer, the first metal layer, and the second metal layer comprise tungsten. In an embodiment the conductive layer is crystalline. In an embodiment the first metal layer is amorphous The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a work function layer over a substrate;
depositing a barrier layer over the work function layer;
depositing a fluorine-free metal layer over the barrier layer;
depositing a first metal layer over the fluorine-free metal layer, wherein a precursor material used to deposit the first metal layer comprises silane; and
depositing a second metal layer over the first metal layer to form a gate stack.

2. The method of claim 1, wherein the depositing the second metal layer comprises using a fluorine-metal precursor.

3. The method of claim 2, wherein the fluorine-free metal layer comprises tungsten (W).

4. The method of claim 3, wherein the first metal layer and the second metal layer comprise W.

5. The method of claim 4, wherein the depositing the fluorine-free metal layer utilizes a fluorine-free precursor that also comprises tungsten.

6. The method of claim 5, wherein the fluorine-free precursor is tungsten chloride.

7. A method comprising:
depositing a work function layer over a substrate, the work function layer comprising aluminum;
depositing a barrier layer over the work function layer, the barrier layer comprising titanium nitride;
using a first fluorine-free atomic layer deposition process, depositing a first metal layer over the barrier layer, the first metal layer comprising a crystalline material;
depositing a second metal layer over the first metal layer, the second metal layer comprising an amorphous material, wherein the depositing the second metal layer is performed at least in part with a second atomic layer deposition process; and
using a fluorine-metal precursor, depositing a third metal layer over the second metal layer, wherein the depositing the third metal layer is performed at least in part with a chemical vapor deposition process.

8. The method of claim 7, wherein the first metal layer, the second metal layer, and the third metal layer comprise tungsten (W).

9. The method of claim 7, wherein the fluorine-metal precursor comprises W and fluorine.

10. The method of claim 7, wherein the first fluorine-free atomic layer deposition process uses tungsten chloride.

11. The method of claim 7, wherein the second atomic layer deposition process utilizes silane.

12. The method of claim 7, wherein the second atomic layer deposition process utilizes diborane.

13. The method of claim 7, further comprising planarizing the third metal layer with first spacers.

14. A method of manufacturing a semiconductor device, the method comprising:
forming a high-K dielectric layer over a substrate;
forming a first barrier layer over the high-K dielectric layer;

forming a work function layer over the high-K dielectric layer, wherein the work function layer has a fluorine concentration of between about 0.1%-atomic and about 1.5%-atomic;

forming a second barrier layer over the work function layer;

forming a conductive layer over the second barrier layer;

forming a first metal layer over the conductive layer, the first metal layer comprising a fluorine by-product; and forming a second metal layer over the first metal layer, the second metal layer comprising a fluorine by-product.

15. The method of claim 14, wherein the conductive layer comprises a plurality of monolayers.

16. The method of claim 15, wherein the first metal layer comprises a plurality of monolayers.

17. The method of claim 14, wherein the conductive layer, the first metal layer, and the second metal layer comprise tungsten.

18. The method of claim 17, wherein the conductive layer is crystalline.

19. The method of claim 18, wherein the first metal layer is amorphous.

20. The method of claim 7, wherein the third metal layer comprises a different material from the second metal layer.

* * * * *